United States Patent
Ko et al.

(10) Patent No.: US 10,781,515 B2
(45) Date of Patent: Sep. 22, 2020

(54) FILM-FORMING METHOD AND FILM-FORMING APPARATUS

(71) Applicant: TOKYO ELECTRON LIMITED, Tokyo (JP)

(72) Inventors: Kyungseok Ko, Gyeonggi-do (KR); Hiromi Shima, Nirasaki (JP); Eiji Kikama, Nirasaki (JP); Keisuke Suzuki, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/291,243

(22) Filed: Mar. 4, 2019

(65) Prior Publication Data

US 2019/0271074 A1 Sep. 5, 2019

(30) Foreign Application Priority Data

Mar. 5, 2018 (JP) .................... 2018-038468

(51) Int. Cl.
*H01L 21/00* (2006.01)
*C23C 16/34* (2006.01)
(Continued)

(52) U.S. Cl.
CPC ...... *C23C 16/345* (2013.01); *C23C 16/45525* (2013.01); *H01L 21/0217* (2013.01);
(Continued)

(58) Field of Classification Search
CPC ............. H01L 21/0217; H01L 21/0228; H01L 21/02211; H01L 21/67109;
(Continued)

(56) References Cited

U.S. PATENT DOCUMENTS 6,825,126 B2* 11/2004 Asai .................... C23C 16/0218
    438/711
6,884,738 B2* 4/2005 Asai .................... C23C 16/405
    438/758
(Continued)

FOREIGN PATENT DOCUMENTS

JP    200649809 A    2/2006
JP    2012146955 A   8/2012

OTHER PUBLICATIONS

Lim et al., "Effect of substrate temperature on the microstructure and photoluminescence properties of ZnO thin film prepared by atomic layer deposition", Thin Solid Films, vol. 515, pp. 3335-3338 (Oct. 17, 2006).*

(Continued)

*Primary Examiner* — Nikolay K Yushin
(74) *Attorney, Agent, or Firm* — Nath, Goldberg & Meyer; Jerald L. Meyer

(57) ABSTRACT

There is provided a method of forming a predetermined film by alternately supplying a film-forming raw material gas and a reaction gas onto a workpiece by an atomic layer deposition (ALD), the method including: beginning an ALD-based film formation at a first temperature at which an adsorption of the film-forming raw material gas occurs; continuing the ALD-based film formation while increasing the first temperature; and completing the ALD-based film formation at a second temperature at which a decomposition of the film-forming raw material gas occurs.

11 Claims, 7 Drawing Sheets

(51) Int. Cl.
*H01L 21/02* (2006.01)
*C23C 16/455* (2006.01)
*H01L 21/67* (2006.01)

(52) U.S. Cl.
CPC .... *H01L 21/0228* (2013.01); *H01L 21/02211* (2013.01); *H01L 21/02329* (2013.01); *H01L 21/67017* (2013.01); *H01L 21/67109* (2013.01)

(58) Field of Classification Search
CPC ......... H01L 21/02329; H01L 21/67017; C23C 16/345; C23C 16/45525; C23C 16/52; C23C 16/45544; C23C 16/45546; C23C 16/46; C23C 16/401
See application file for complete search history.

(56) References Cited

U.S. PATENT DOCUMENTS

| | | | | |
|---|---|---|---|---|
| 7,557,013 | B2* | 7/2009 | Bhat | H01L 27/10852 257/532 |
| 8,461,059 | B2* | 6/2013 | Ikeuchi | C23C 16/402 257/E21.272 |
| 9,881,790 | B2* | 1/2018 | Dube | H01L 21/02532 |
| 2003/0181060 | A1* | 9/2003 | Asai | C23C 16/405 438/758 |
| 2004/0043544 | A1* | 3/2004 | Asai | C23C 16/0218 438/149 |
| 2007/0238259 | A1* | 10/2007 | Bhat | H01L 27/10852 438/381 |
| 2008/0099147 | A1* | 5/2008 | Myo | C23C 16/45565 156/345.34 |
| 2008/0199614 | A1* | 8/2008 | Li | C23C 16/45544 427/255.34 |
| 2009/0035951 | A1* | 2/2009 | Miya | C23C 16/405 438/787 |
| 2011/0021033 | A1* | 1/2011 | Ikeuchi | C23C 16/402 438/758 |
| 2016/0300715 | A1* | 10/2016 | Dube | H01L 21/02532 |

OTHER PUBLICATIONS

Johnson et al., "A brief review of atomic layer deposition: from fundamentals to applications", 2014, Materials Today, vol. 17 No. 5, pp. 236-246 (Jun. 2014).*

* cited by examiner

550°C

600°C

630°C

FILM-FORMING METHOD AND FILM-FORMING APPARATUS

CROSS-REFERENCE TO RELATED APPLICATION

This application claims the benefit of Japanese Patent Application No. 2018-038468, filed on Mar. 5, 2018, in the Japan Patent Office, the disclosure of which is incorporated herein in its entirety by reference.

TECHNICAL FIELD

The present disclosure relates to a film-forming method and a film-forming apparatus using an atomic layer deposition (ALD) method.

BACKGROUND

In recent years, with the progress of miniaturization and integration of semiconductor devices, it is required to form a thin and uniform film with high step coverage. For this purpose, instead of a conventional chemical vapor deposition (CVD) method, an atomic layer deposition (ALD) method utilizing adsorption of film-forming raw materials has attracted attention.

For example, in a vertical batch type heat treatment apparatus, there is known a technique for alternately supplying a silicon raw material gas and a nitriding gas to form a silicon nitride film (SiN film) based on an ALD method.

A typical ALD method is carried out at a relatively low temperature at which a film-forming raw material (precursor) can be adsorbed and at a temperature where the film-forming material is not quite decomposed. Thus, even if there is a variation in the surface temperature of a workpiece, it is possible to form a uniform film with a high step coverage at the same cycle rate. However, a typical problem with the ALD method is that a film formation rate is low and thus productivity is low. Therefore, in the actual film formation of a SiN film, an ALD-based film formation is performed by setting a film formation temperature relatively high at which the silicon raw material gas is decomposed such that a CVD-based reaction also occurs. In addition, by setting the film formation temperature at a high temperature, it is possible to obtain a high-quality film with fewer impurities.

However, when performing the ALD-based film formation at a relatively high temperature as described above, it may be difficult in some cases to form a film having a small film thickness with good in-plane uniformity.

As a technique for forming a thin SiN film with good in-plane uniformity, for example, there is known a film-forming method which includes supplying an aminosilane-based gas to a surface of a workpiece to form a seed layer, and forming a SiN film on the seed layer using an ALD method.

Such a film-forming method is capable of forming a SiN film having a small film thickness with good in-plane uniformity, but includes an additional step of forming the seed layer. This does not necessarily improve productivity.

SUMMARY

Some embodiments of the present disclosure provide a technique capable of forming a film with high in-plane uniformity while maintaining high productivity using an atomic layer deposition method even though the thickness of the film is thin.

According to one embodiment of the present disclosure, there is provided a method of forming a predetermined film by alternately supplying a film-forming raw material gas and a reaction gas onto a workpiece by an atomic layer deposition (ALD), the method including: beginning an ALD-based film formation at a first temperature at which an adsorption of the film-forming raw material gas occurs; continuing the ALD-based film formation while increasing the first temperature; and completing the ALD-based film formation at a second temperature at which a decomposition of the film-forming raw material gas occurs.

According to another embodiment of the present disclosure, there is provided an apparatus for forming a predetermined film by alternately supplying a film-forming raw material gas and a reaction gas on a workpiece using an atomic layer deposition (ALD), including: a processing container in which the workpiece is accommodated; a raw material gas supply part configured to supply the film-forming raw material gas and the reaction gas to the processing container; a heating mechanism configured to heat the workpiece; an exhaust mechanism configured to exhaust an interior of the processing container such that the interior of the processing container is kept in a depressurized state; and a controller configured to control the gas supply part, the heating mechanism, and the exhaust mechanism, wherein the controller controls a process which includes: beginning an ALD-based film formation at a first temperature at which an adsorption of the film-forming raw material gas occurs; continuing the ALD-based film formation while increasing the first temperature; and completing the ALD-based film formation at a second temperature when decomposition of the film-forming raw material gas occurs.

According to yet another embodiment of the present disclosure, there is provided a non-transitory computer-readable storage medium storing a program that operates on a computer and controls a film-forming apparatus, wherein the program, when executed, causes the computer to control the film-forming apparatus so as to perform the aforementioned method.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Hereinafter, embodiments of the present disclosure will be described with reference to the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Application to SiN Film>

An example in which a film-forming method according to the present disclosure is applied to the formation of a SiN film will be described. Here, a semiconductor wafer (hereinafter simply referred to as a "wafer") W is used as a workpiece, and a SiN film is formed on the wafer A by an ALD method.

Figure 1:
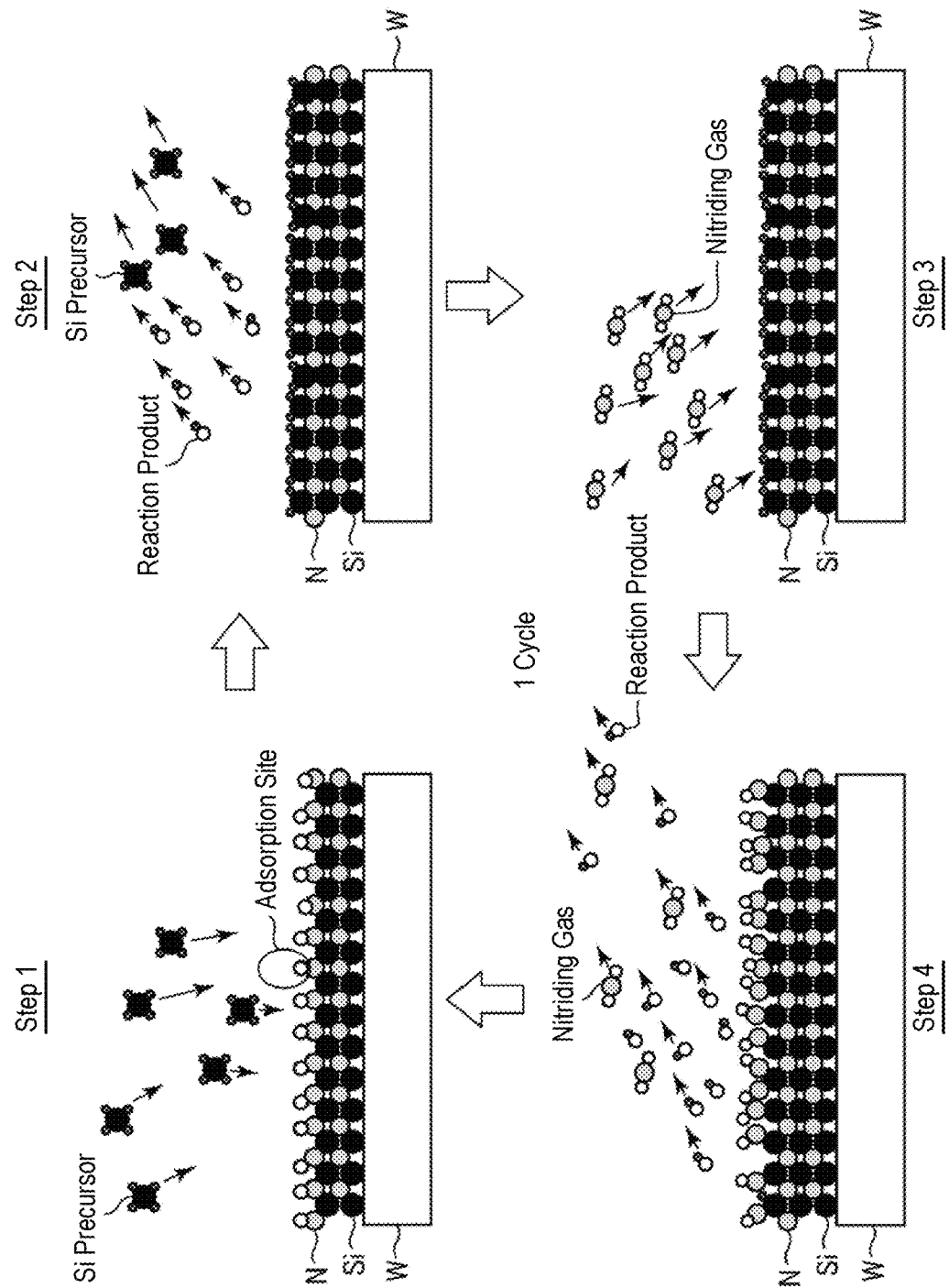
FIG. 1 illustrates a schematic view for explaining an ALD-based film formation.

As illustrated in FIG. 1, a typical ALD method repeats a cycle a number of times, where the cycle includes supplying a Si raw material gas (Si precursor) as a film-forming raw material gas into a processing container in a state in which the wafer W is placed in the processing container so as to cause the Si raw material gas to be adsorbed onto a surface to be processed of the workpiece (Step 1); discharging residual gas from the processing container (purging step) (Step 2); supplying a nitriding gas as a reaction gas into the processing container to nitride the adsorbed Si raw material gas (Step 3); and discharging the residual gas from the processing container (purging step) (Step 4).

In Step 1, the Si precursor is supplied such that one atomic layer of the Si precursor is adsorbed onto adsorption sites of the surface to be processed.

In Step 2, the Si precursor as a residual gas remaining in an unreacted state after Step 1 and a reaction product are discharged from the processing container by, for example, purging with an inert gas. Thus, clean reaction sites are formed.

In Step 3, the nitriding gas is supplied to be adsorbed onto the one atomic layer of Si precursor, such that the Si precursor and the nitriding gas react with each other.

In Step 4, the nitriding gas as a residual gas remaining in an unreacted state after Step 3 and a reaction product are discharged from the processing container by, for example, purging with an inert gas. Thus, clean reaction sites are formed.

As the Si precursor, chlorine-containing silane compounds such as dichlorosilane (DCS: $SiH_2Cl_2$), monochlorosilane (MCS: $SiClH_3$), trichlorosilane (TCS: $SiHCl_3$), silicon tetrachloride (STC: $SiCl_4$), and hexachlorodisilane (HCD: $Si_2Cl_6$) may be suitably used. Among these, HCD may be preferably used.

As the nitriding gas, for example, an ammonia ($NH_3$) gas, a hydrazine ($N_2H_4$) gas, and a derivative thereof (e.g., monomethyl hydrazine (MMH) gas) may be used.

Figure 2:
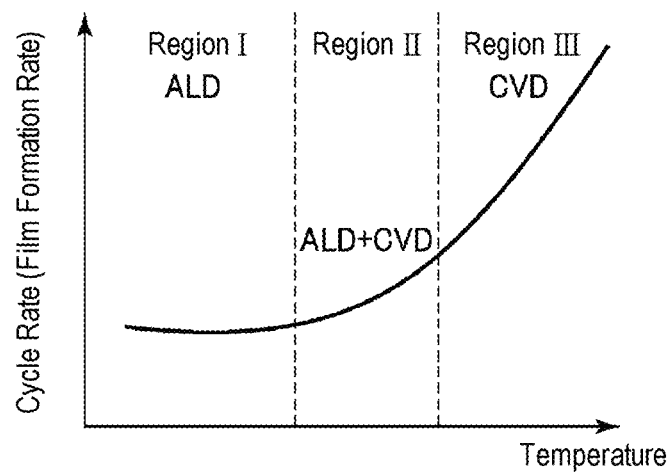
FIG. 2 illustrates a diagram illustrating a relationship between a film formation temperature and a cycle rate (film formation rate) in which an ALD region, an ALD+CVD region, and a CVD region are shown.

As described above, the typical ALD method is carried out at a relatively low temperature at which a film-forming raw material (precursor) is capable of being adsorbed and at a temperature at which the film-forming material is hardly decomposed. Thus, even if there is a variation in the surface temperature of the workpiece, it is possible to form a uniform film with high step coverage at the same cycle rate. However, the typical ALD method has a problem in that a film formation rate is low and thus productivity is low. Meanwhile, in the CVD method, film formation is generally performed at a temperature at which almost all of the film-forming material is decomposed and thus productivity is high. However, the CVD method is poor in uniformity and step coverage. For this reason, in the related art, the film formation temperature is set to a relatively high temperature at which decomposition occurs in some of the Si precursor, and a CVD-based reaction is also caused. Thus, a semi-ALD process is performed under a condition where a film formation rate (cycle rate) is high, namely under a condition where a region II as an ALD+CVD region is formed between a region I as an ALD region and a region III as a CVD region, as illustrated in FIG. 2. As a result, it is possible to perform film formation having both the advantages of the ALD method which is good in uniformity and step coverage, and the advantages of the CVD method which achieves high productivity.

For example, when an HCD gas is used as the Si precursor and an $NH_3$ gas is used as the nitriding gas, the ALD-based film formation may be performed at about 550 degrees C. at which the HCD gas can be adsorbed. However, in the related art, an ALD cycle is carried out at a temperature at which decomposition of the HCD gas occurs (a temperature at which the CVD-based reaction occurs), for example, at 630 degrees C.

The semi-ALD process will be described by taking, as an example, a batch type heat treatment apparatus. In the batch type heat treatment apparatus, a plurality of wafers are loaded into the processing container in a state where the wafers are mounted on a wafer boat, and subsequently, film formation is performed using a temperature profile represented in FIG. 3. That is to say, a heating device is provided outside the processing container. In one embodiment, the heating device may be set such that an internal temperature of the processing container becomes 630 degrees C. A temperature of the wafer is raised from about 500 degrees C. when the wafer boat is carried into the processing container up to a set temperature of 630 degrees C. The temperature is stabilized at 630 degrees C. The actual ALD process begins in a state in which the wafers are maintained at the respective temperature.

Figure 3:
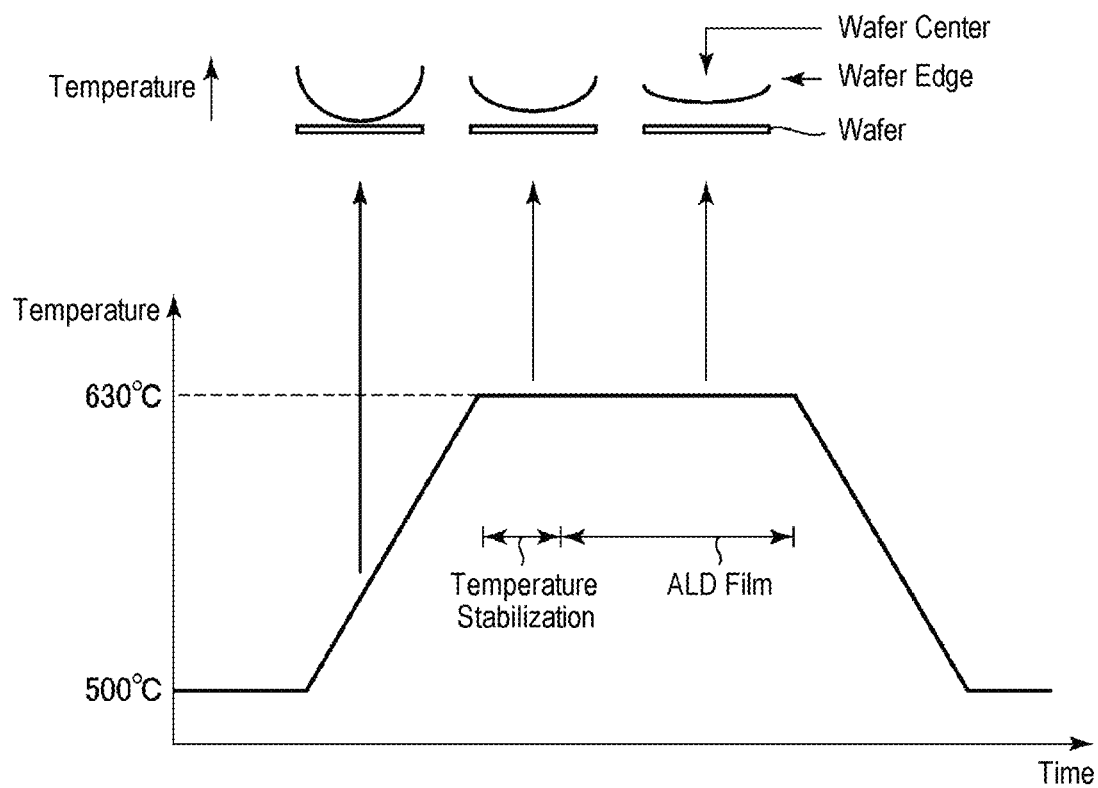
FIG. 3 illustrates a diagram representing a temperature profile and a wafer temperature distribution during a conventional semi-ALD process.

In the batch type heat treatment apparatus, since the heating device is provided at the side of an outer periphery of the processing container, heat is radiated from the edge of each wafer toward the center thereof. Therefore, as illustrated in FIG. 3, a temperature distribution in which a temperature of an edge portion of the wafer W is higher than that of a center portion of the wafer W until the temperature rises from 500 degrees C. to 630 degrees C. is established. For this reason, the temperature is stabilized at 630 degrees C. The film formation begins in the state where the temperature becomes uniform as much as possible.

However, since the heating device is provided outside the processing container, even if such a temperature stabilization period is set, the temperature distribution in which the temperature of the edge portion of the wafer W is still higher than that of the center portion thereof.

Figure 4:
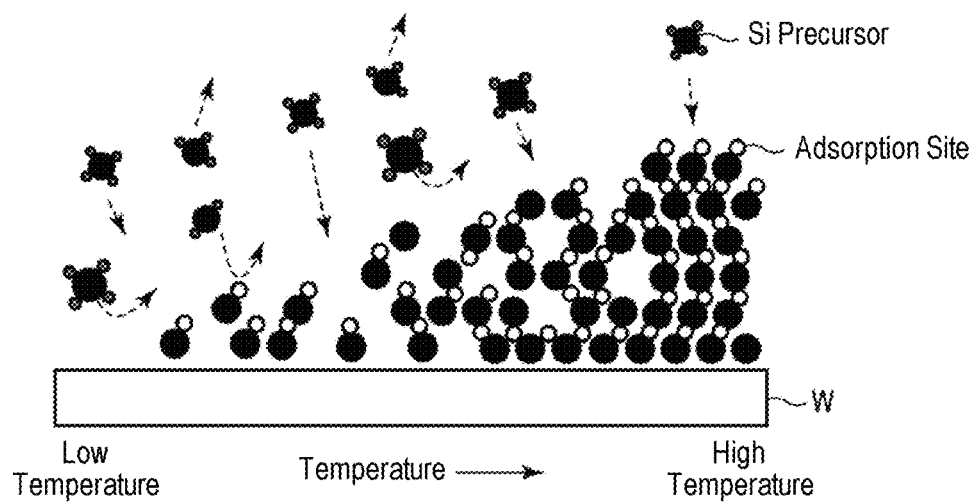
FIG. 4 illustrates a schematic view illustrating a relationship between a wafer temperature and an adsorption amount of a Si precursor.

Meanwhile, as illustrated in FIG. 4, at the temperature where the Si precursor decomposes (the temperature at which the CVD-based reaction occurs), the adsorption amount of the Si precursor onto the wafer W increases as the temperature increases.

Therefore, in the film formation performed at the temperature (for example, at 630 degrees C.) where the CVD-based reaction occurs, during the initial stage of film formation, the adsorption amount of the Si precursor onto the wafer W is greater in the edge portion. Thus, the film formation in the center portion of the wafer W is delayed relative to the edge portion.

Figure 5:
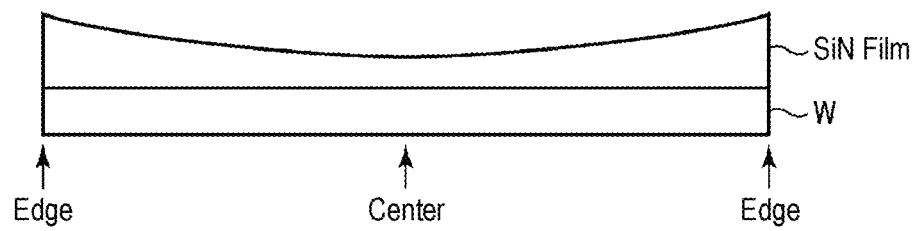
FIG. 5 illustrates a diagram representing a film thickness distribution of a SiN film when the conventional semi-ALD process is used.

In the case of forming a thin film through the semi-ALD process, the film thickness distribution during the initial stage of film formation, specifically, the distribution of the adsorption amount available when the precursor is initially adsorbed greatly affects the final film thickness distribution. Thus, in the conventional semi-ALD process performed at 630 degrees C. using the HCD gas, as shown in FIG. 5, the film thickness distribution of the formed SiN film tends to show a concave distribution in which the edge portion of the wafer W is thick and the center portion thereof is thin. For this reason, it may be difficult to form a film having a thin thickness with good in-plane uniformity in some cases. These kinds of deterioration in the in-plane uniformity increases as the film formation temperature increases. For example, when the film formation temperature becomes 700 degrees C. or more at which the HCD gas is almost completely decomposed, an in-plane variation (non-uniformity) of the film thickness in a top portion of the wafer boat at which the in-plane uniformity of the film thickness tends to deteriorate, becomes more than twice that at 630 degrees C.

Therefore, in this embodiment, in order to achieve both the productivity and the film thickness uniformity, a film formation start temperature is set to a low temperature at which only the adsorption of the precursor occurs and the decomposition of the precursor does not occur at the film formation temperature in the typical ALD method, and the ALD-based film formation is continuously performed while raising (ramping up) the temperature. The ALD-based film formation is completed at a predetermined temperature at which the decomposition of the precursor occurs. At this time, the ALD procedure is carried out by repeating, a multiple number of times, the cycle of Steps 1 to 4 of the above-described typical ALD-based film formation, except that the adsorption amount in Step 1 varies with temperature.

Figure 6:
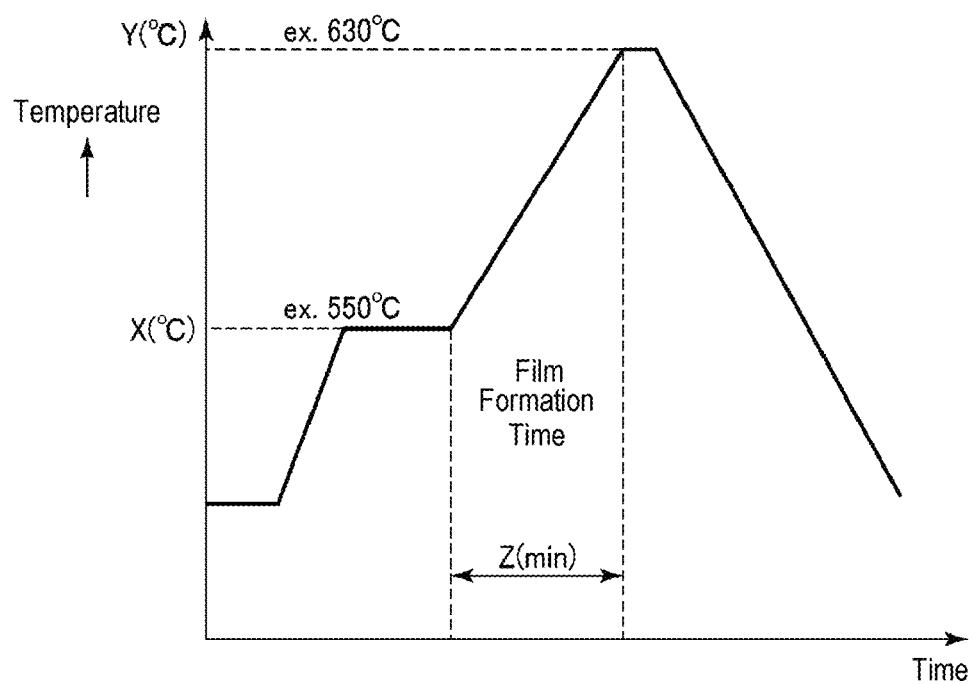
FIG. 6 illustrates a diagram representing a temperature profile of a film-forming method according to an embodiment of the present disclosure.

Specifically, as illustrated in FIG. 6, a temperature stabilization process is performed at X degrees C. which is the film formation start temperature, and subsequently, the film formation begins at the respective temperature. The ALD-based film formation is performed for a period of film formation time Z (min) until the temperature is increased to reach a film formation end temperature Y (degrees C.) is. By appropriately setting X, Y, and Z, it is possible to perform a desired film formation. The film formation may be completed when the film formation end temperature Y (degrees C.) is reached. Depending on a film thickness of a film to be formed, the ALD-based film formation may continue for a predetermined period of time at Y (degrees C.). In addition, in FIG. 6, for the sake of convenience in description, an example in which the temperature is linearly increased. However, the present disclosure is not necessarily limited thereto.

In one embodiment, where the HCD is used as the Si precursor and the NH$_3$ gas is used as the nitriding gas, the film formation start temperature X may fall within a range of 530 to 570 degrees C. As an example, the film formation start temperature X may be 550 degrees C. The film formation end temperature Y may fall within a range of 610 to 650 degrees C. As an example, the film formation end temperature X may be 630 degrees C. The period of film formation time Z may be appropriately determined depending on the film thickness.

Examples of other conditions may be as follows:
Pressure: 133 to 1,333 Pa (1 to 10 Torr)
Flow rate of HCD gas: 10 to 1,000 sccm
Flow rate of NH$_3$ gas: 100 to 10,000 sccm
Period of time of Step 1: 0.1 to 5 min
Period of time of Step 2: 0.1 to 10 min
Period of time of Step 3: 0.1 to 5 min
Period of time of Step 4: 0.1 to 10 min The number of cycles varies depending on the film thickness and is, for example, between 10 to 100 cycles.

Figure 7A:
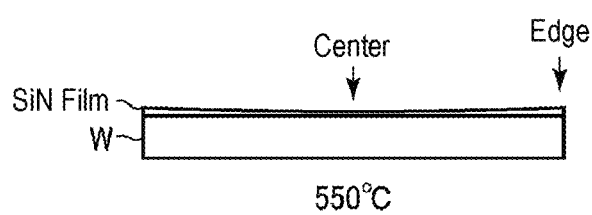
FIGS. 7A to 7C are diagrams for explaining the transition of a film thickness distribution of a SiN film when the film-forming method according to an embodiment of the present disclosure is performed.
Figure 7B:
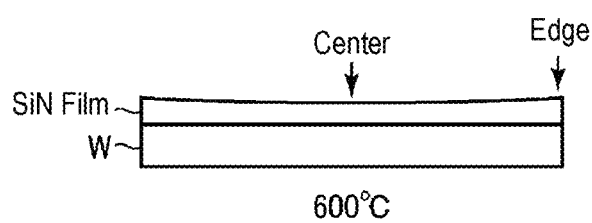
Figure 7C:
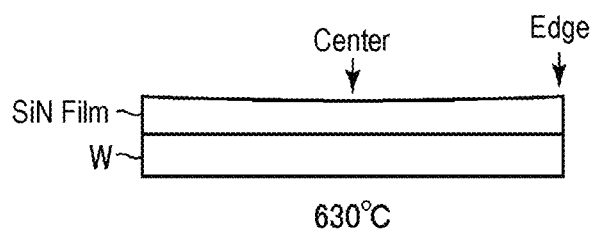

According to the film-forming method of the present embodiment, since the temperature at the precursor is initially adsorbed (which has a large influence on the final film thickness distribution), is a low temperature (e.g., 550 degrees C.) at which only adsorption occurs and decomposition does not occur, it is possible to make the adsorption amount of the precursor uniform. It is therefore possible to increase the in-plane film thickness uniformity at the initial state of film formation as illustrated in FIG. 7A. Once the film becomes uniform during the initial stage, as illustrated in FIGS. 7B and 7C, even if the film formation temperature is increased to 600 degrees C. (or ultimately 630 degrees C.), the in-plane film thickness uniformity is maintained. Thus, even if the film thickness is small, it is possible to form a film having a high in-plane film thickness uniformity. In addition, since the film formation is performed at a low temperature at which decomposition of the precursor does not occur at the initial stage of film formation, the cycle rate (film formation rate) is low. However, since the temperature is increased to a temperature at which decomposition of the precursor occurs during the period of film formation time, it is possible to increase the cycle rate (film formation rate), which makes it possible to suppress deterioration in productivity. That is to say, according to this embodiment, it is possible to achieve both productivity and the in-plane film thickness uniformity.

As described above, in the case of the batch type heat treatment apparatus in the related art, the wafer in-plane thickness uniformity of a formed film at the top portion of the wafer boat tends to deteriorate. This may be due to the supply amount of the precursor tending to decrease toward the top portion of the wafer boat. In contrast, in this embodiment, since the uniformity of the film thickness at the initial stage of the film formation is high, it is possible to make the wafer in-plane film thickness uniform even at the top portion of the wafer boat. Further, by improving the wafer in-plane film thickness uniformity at the top portion of the wafer boat, it is possible to improve a wafer inter-plane film thickness uniformity.

Subsequently, in practice, SiN films were formed using the conventional method and the method of this embodiment using the HCD gas as the Si precursor and the NH$_3$ gas as the nitriding gas in the batch type heat treatment apparatus.
Conditions used for this embodiment were as follows.

(Common Condition)
Pressure: 133 Pa (1 Torr)
Flow rate of HCD gas: 300 sccm
Flow rate of $NH_3$ gas: 5,000 sccm
(Conditions of Conventional Method)
Film formation temperature: 630 degrees C.
Period of film formation time: 60 min
Number of cycles: 20 times
(Conditions of Method of this Embodiment)
Film formation start temperature X: 550 degrees C.
Film formation end temperature Y: 630 degrees C.
Period of film formation time: 60 min
Number of cycles: 20 times Under these conditions, film thicknesses and the uniformity thereof were determined.

As a result, the average value of the film thicknesses was 31.8 nm using the conventional method and 28.2 nm using the method of this embodiment. In addition, the wafer in-plane film thickness uniformity (variation range) at the top portion of the wafer boat was 3.18% using the conventional method and 1.98% using the method of this embodiment. From these results, it was confirmed that the wafer in-plane film thickness uniformity at the top portion of the wafer boat was better using the method of this embodiment than using the conventional method under these conditions where there was no significant difference in the average film thickness between the conventional method and the method of this embodiment. In addition, the wafer inter-plane film thickness uniformity (variation range) was 1.94% using the conventional method, and 1.24% using this embodiment. From these results, it was confirmed that the method of this embodiment was better than the conventional method in terms of the wafer inter-plane film thickness uniformity.

<Processing Apparatus>

Figure 8:
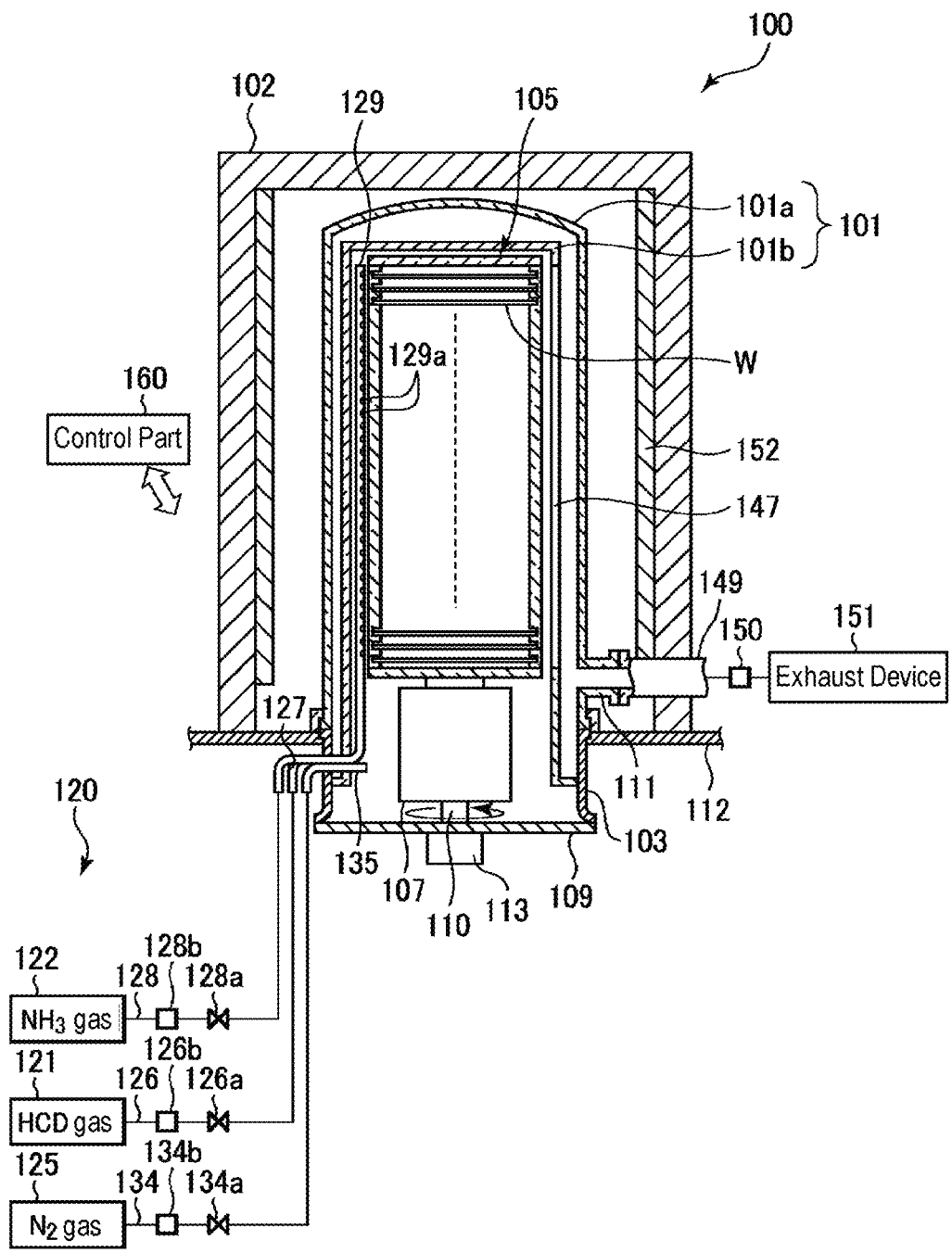
FIG. 8 illustrates a vertical cross-sectional view illustrating an example of a film-forming apparatus applicable to the film-forming method according to an embodiment of the present disclosure.
Figure 9:
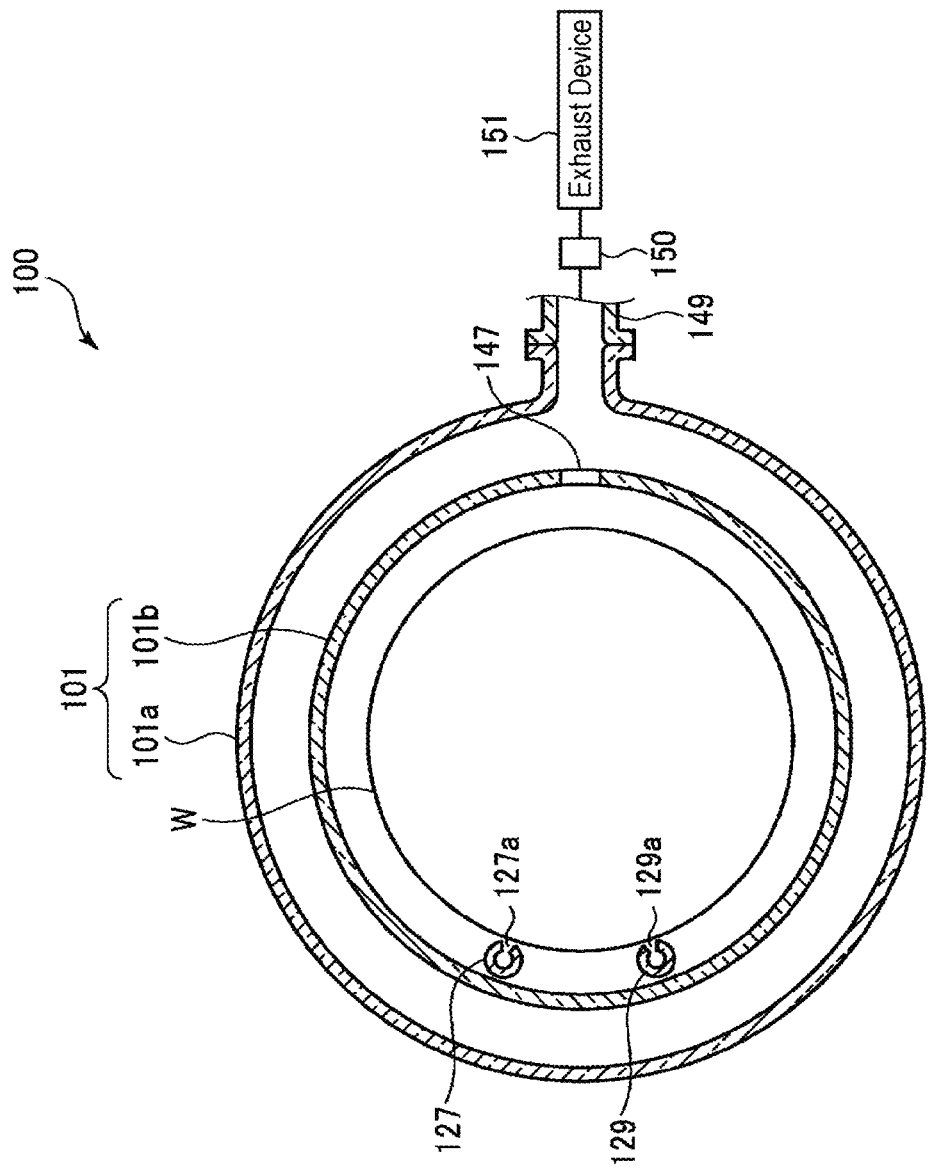
FIG. 9 illustrates a horizontal cross-sectional view illustrating the example of the film-forming apparatus applicable to the film-forming method according to an embodiment of the present disclosure.

Next, an example of a film-forming apparatus, which is applicable to the film-forming method according to the above embodiment will be described. FIG. 8 is a vertical cross-sectional view illustrating an example of a film-forming apparatus applicable to the film-forming method according to the above embodiment, and FIG. 9 is a horizontal cross-sectional view of the film-forming apparatus.

The film-forming apparatus 100 of this embodiment may be a hot wall type vertical batch type heat treatment apparatus, and includes a processing container 101 having a ceiling and configured as a reaction tube having a double tube structure composed of an outer tube 101a and an inner tube 101b. The entire processing container 101 is made of, for example, quartz. A quartz wafer boat 105 in which 50 to 150 sheets of wafers W are placed in multiple stages is disposed inside the inner tube 101b of the processing container 101. A substantially cylindrical main body part 102 at which a lower surface is opened is provided outside the processing container 101. A heating mechanism 152 equipped with a heater is provided on an inner wall surface of the main body part 102 in the circumferential direction. The main body part 102 is supported by a base plate 112.

A manifold 103 made of, for example, stainless steel and formed in a cylindrical shape is coupled to a lower end opening of the outer tube 101a of the processing container 101 via a seal member (not illustrated) such as an O-ring.

The manifold 103 supports the outer tube 101a of the processing container 101. The wafer boat 105 is inserted into the inner tube 101b of the processing container 101 from below the manifold 103. A bottom portion of the manifold 103 is closed by a lid part 109.

The wafer boat 105 is mounted on a heat insulating cylinder 107 made of quartz. A rotary shaft 110 is attached to the heat insulating cylinder 107 while penetrating through the lid part 109. The rotary shaft 110 is configured to be rotatable by a rotary drive mechanism 113 such as a motor. With this configuration, the wafer boat 105 can be rotated with the rotation of the heat insulating cylinder 107 by the rotary drive mechanism 113. The heat insulating cylinder 107 may be fixedly provided on the lid part 109, and the wafers W may be processed without rotating the wafer boat 105.

The processing apparatus 100 includes a gas supply mechanism 120 configured to supply various gases. The gas supply mechanism 120 includes an HCD gas supply source 121 configured to supply an HCD gas as a Si precursor, a $NH_3$ gas supply source 122 configured to supply an $NH_3$ gas as a nitriding gas, and an $N_2$ gas supply source 125 configured to supply an $N_2$ gas as an inert gas.

A pipe 126 is connected to the HCD gas supply source 121. A gas dispersion nozzle 127 made of quartz is connected to the pipe 126. The gas dispersion nozzle 127 penetrates through sidewalls of the manifold 103 and the inner tube 101b of the processing container 101, is bent upward and extends vertically inside the inner tube 101b. A pipe 128 is connected to the $NH_3$ gas supply source 122. A gas dispersion nozzle 129 made of quartz is connected to the pipe 128. The gas dispersion nozzle 129 penetrates through sidewalls of the manifold 103 and the inner tube 101b of the processing container 101, is bent upward and extends vertically inside the inner tube 101b. A pipe 134 is connected to the $N_2$ gas supply source 125. A gas nozzle 135 made of quartz is connected to the pipe 134. The gas nozzle 135 penetrates through sidewalls of the manifold 103 and the inner tube 101b to linearly extend inside the processing container 101.

An opening/closing valve 126a and a flow rate controller 126b such as a mass flow controller installed at the upstream side of the opening/closing valve 126a are provided in the pipe 126. Similarly, opening/closing valves 128a and 134a, and flow rate controllers 128b and 134b are provided in the respective pipes 128 and 134.

In vertical portions of the gas dispersion nozzles 127 and 129, a plurality of gas ejection holes 127a and 129a is formed at predetermined intervals in a correspondence with the respective wafers W over a vertical length corresponding to a wafer support range in the wafer boat 105 (only the gas ejection holes 129a are illustrated in FIG. 8). With this configuration, gas is capable of being ejected substantially uniformly from each of the gas ejection holes 127a and 129a toward the processing container 101 in the horizontal direction.

An exhaust opening 147 through which the interior of the processing container 101 is evacuated is formed in a portion facing the arrangement position of the gas dispersion nozzles 127 and 129 in the inner tube 101b of the processing container 101. The exhaust opening 147 is formed in a vertically elongated shape in a correspondence relationship with the wafer boat 105. On the other hand, an exhaust port 111 is formed in the outer tube 101a of the processing container 101 in the vicinity of the exhaust opening 147. An exhaust pipe 149 for exhausting the processing container 101 is connected to the exhaust port 111. A pressure control valve 150 configured to control an internal pressure of the processing container 101, and an exhaust device 151 including, for example, a vacuum pump, are connected to the exhaust pipe 149. The interior of the processing container 101 is exhausted from the exhaust pipe 149 by the exhaust device 151.

The processing container 101 and the wafers W placed inside the processing container 101 are heated to a predetermined temperature by supplying power to the heating mechanism 152 provided inward of the main body part 102 described above.

The processing apparatus 100 includes a control part 160. The control part 160 controls respective components of the processing apparatus 100, for example, valves, mass flow controllers as flow rate controllers, a drive mechanism such as a lifting mechanism, the heating mechanism 152 and the like. The control part 160 includes a main control part equipped with a CPU, an input device, an output device, a display device, and a storage device. A storage medium that stores a program for controlling a process to be executed in the film-forming apparatus 100, namely processing recipes, is set in the storage device. The main control part reads out a predetermined processing recipe stored in the storage medium and controls the film-forming apparatus 100 to perform a predetermined process on the basis of the processing recipe thus read out.

Next, a processing operation of the film-forming apparatus 100 will be described.

The film formation is performed as follows by the control part 160 based on the processing recipes stored in the storage medium.

First, a plurality of, for example, 50 to 150 wafers W is placed in the wafer boat 105. The wafer boat 105 is inserted into the processing container 101 of the film-forming apparatus 100 from below, whereby the plurality of wafers W is accommodated in the inner tube 101b of the processing container 101. Then, the lower end opening of the manifold 103 is closed by the lid part 109 so that an internal space of the processing container 101 is hermetically sealed.

Subsequently, the $N_2$ gas as an inert gas is supplied into the processing container 101 from the $N_2$ gas supply source 125 while controlling the internal pressure of the processing container 101 to a predetermined pressure in the range of 1 to 10 Torr (133 to 1,333 Pa) by exhausting the interior of the processing container 101 by the exhaust device 151. Thus, the processing container 101 is kept in an $N_2$ gas atmosphere which remains in a predetermined depressurized state. At this time, an internal temperature of the processing container 101 (the temperature of the wafers W) is increased by the heating mechanism 152 to a temperature at which the HCD gas is capable of being adsorbed and decomposition does not occur, for example, at 550 degrees C.

When the temperature of the wafers W reaches 550 degrees C., the temperature is stabilized for a predetermined period of time, and subsequently, the ALD-based film formation begins. The control part 160 increases the output of the heating mechanism 152 to increase the internal temperature of the processing container 101 (the temperature of the wafers).

The ALD-based film formation is performed by repeating an operation which includes: supplying the HCD gas from the HCD gas supply source 121 via the pipe 126 and the gas ejection holes 127a of the gas dispersion nozzle 127 along the surfaces of the wafers W so as to cause the HCD gas to be adsorbed onto the surfaces of the wafers W in the state in which the supply of the $N_2$ gas is continued; stopping the supply of the HCD gas to purge the interior of the processing container 101 with the $N_2$ gas; supplying the $NH_3$ gas from the $NH_3$ gas supply source 122 along the surfaces of the wafers W through the pipe 128 and the gas ejection holes 129a of the gas dispersion nozzle 129 to nitride the Si adsorbed onto the surfaces of the wafers W, and stopping the supply of the $NH_3$ gas to purge the interior of the processing container 101 with the $N_2$ gas.

Then, the ALD-based film formation is continued to reach a predetermined temperature at which the HCD gas is decomposed, for example, at 630 degrees C. Thereafter, the ALD-based film formation is completed. In some embodiments, depending on a film thickness, the ALD-based film formation may be continued for a predetermined period of time at the temperature of 630 degrees C.

After the above-described film-forming process is completed, the interior of the processing container 101 is purged with the $N_2$ gas, and subsequently, the interior of the processing container 101 is returned to atmospheric pressure. The wafer boat 105 is unloaded downward.

According to the above-described film-forming process, since the temperature when the precursor is initially adsorbed is low, it is possible to increase the film thickness uniformity at the initial stage of film formation. Thus, even when the film formation temperature is increased, the in-plane film thickness uniformity is maintained, which makes it possible to form a film with high in-plane film thickness uniformity. In addition, by increasing the film formation temperature to a temperature at which decomposition of the precursor occurs during the period of film formation time to increase the cycle rate (film formation rate), it is possible to suppress deterioration in productivity.

<Other Applications>

While embodiments of the present disclosure have been described above, the present disclosure is not limited to the above-described embodiments and may be variously modified without departing from the present disclosure.

In the above embodiments, the SiN film is described as an example of a film to be formed, but the present disclosure is not limited thereto as long as the film can be formed by the ALD method. As an example, the present disclosure is applicable in forming other films such as an $SiO_2$ film, and an $Al_2O_3$ film.

In the above-described embodiments, application to the batch type heat treatment apparatus was described. However, the present disclosure is not limited thereto and may be applied to other apparatuses such as a horizontal batch type apparatus, a single wafer type apparatus, and a semi-batch type apparatus that carries out a processing on a plurality of workpieces mounted on a rotary table. For example, in the case of the single wafer type apparatus, a workpiece is generally heated by a heater provided in a stage. However, a temperature of the workpiece may vary in some cases. In this case, in the conventional temperature profile, non-uniformity in film thickness occurs as in the batch type apparatus. Therefore, in order to form the temperature profile of the present disclosure, the temperature is quickly adjusted by, for example, separating the workpiece from the stage by a predetermined distance using lifting pins. As a result, it is possible to form a uniform film.

In addition, in the above-described embodiments, the example in which the semiconductor wafer is used as a workpiece has been described. However, the present disclosure is not limited thereto. Other objects such as a glass substrate and a ceramic substrate may be used as the workpiece.

According to the present disclosure, an ALD-based film formation begins at a temperature at which only the adsorption of a film-forming raw material gas occurs. The ALD-based film formation is continued while increasing the temperature. The ALD-based film formation is completed at a temperature at which the decomposition of the film-forming raw material gas occurs. Thus, it is possible to form a film with good in-plane uniformity while maintaining high productivity even if a thickness of the film is small.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a predetermined film by alternately supplying a film-forming raw material gas and a reaction gas onto a workpiece by an atomic layer deposition (ALD), the method comprising:
    beginning an ALD-based film formation at a first temperature at which an adsorption of the film-forming raw material gas occurs;
    continuing the ALD-based film formation while increasing a temperature from the first temperature without decreasing the temperature; and
    completing the ALD-based film formation at a second temperature at which a decomposition of the film-forming raw material gas occurs, the second temperature being higher than the first temperature.

2. The method of claim 1, wherein the ALD-based film formation is completed when reaching the second temperature.

3. The method of claim 1, wherein the ALD-based film formation continues at the second temperature for a predetermined period of time depending on a thickness of the predetermined film.

4. The method of claim 1, further comprising:
    stabilizing the workpiece at the first temperature in a state where the film-forming raw material gas and the reaction gas are not supplied; and
    subsequently, beginning the ALD-based film formation by supplying the film-forming raw material gas and the reaction gas.

5. The method of claim 1, wherein the ALD-based film formation is performed by a batch type apparatus which performs a film formation on a plurality of workpieces in a collective manner.

6. A non-transitory computer-readable storage medium storing a program that operates on a computer and controls a film-forming apparatus, wherein the program, when executed, causes the computer to control the film-forming apparatus so as to perform the method of claim 1.

7. The method of claim 1, wherein a silicon raw material gas containing a silicon is used as the film-forming raw material gas, a nitriding gas which nitrides the silicon raw material gas is used as the reaction gas, and a silicon nitride film is the predetermined film.

8. The method of claim 7, wherein the silicon raw material gas is a hexachlorodisilane gas, and the nitriding gas is an ammonia gas.

9. The method of claim 8, wherein the first temperature falls within a range of 530 to 570 degrees C., and the second temperature falls within a range of 610 to 650 degrees C.

10. An apparatus for forming a predetermined film by alternately supplying a film-forming raw material gas and a reaction gas on a workpiece using an atomic layer deposition (ALD), comprising:
    a processing container in which the workpiece is accommodated;
    a raw material gas supply part configured to supply the film-forming raw material gas and the reaction gas to the processing container;
    a heating mechanism configured to heat the workpiece;
    an exhaust mechanism configured to exhaust an interior of the processing container such that the interior of the processing container is kept in a depressurized state; and
    a controller configured to control the gas supply part, the heating mechanism, and the exhaust mechanism,
    wherein the controller controls a process which includes:
    beginning an ALD-based film formation at a first temperature at which an adsorption of the film-forming raw material gas occurs;
    continuing the ALD-based film formation while increasing a temperature from the first temperature without decreasing the temperature; and
    completing the ALD-based film formation at a second temperature when decomposition of the film-forming raw material gas occurs, the second temperature being higher than the first temperature.

11. The apparatus of claim 10, wherein the apparatus is a batch type apparatus performing a batch process on a plurality of workpieces accommodated in the processing container.

* * * * *